US005767508A

United States Patent [19]
Masui et al.

[11] Patent Number: 5,767,508
[45] Date of Patent: Jun. 16, 1998

[54] PHOTOELECTRIC SENSOR HAVING A LIGHT GUIDE BUILT-IN

[75] Inventors: Mayumi Masui; Yoshiki Shibuya, both of Tokyo, Japan

[73] Assignee: Oki Electric Industry Co., Ltd., Tokyo, Japan

[21] Appl. No.: 652,107

[22] Filed: May 23, 1996

[30] Foreign Application Priority Data

May 29, 1995 [JP] Japan ................... 7-130840

[51] Int. Cl.⁶ .................. H01J 5/16; H01L 29/74
[52] U.S. Cl. ............. 250/227.11; 250/551; 257/435
[58] Field of Search ................... 250/227.11, 551; 257/80, 81, 82, 433, 435; 385/34, 90–93

[56] References Cited

U.S. PATENT DOCUMENTS

| 4,677,454 | 6/1987 | Kiyuhara . |
| 4,785,338 | 11/1988 | Kinoshita et al. . |
| 4,933,729 | 6/1990 | Soejima et al. . |
| 4,978,843 | 12/1990 | Yamakawa . |
| 5,105,239 | 4/1992 | Uchino et al. . |
| 5,189,716 | 2/1993 | Matsubara et al. ............. 250/227.11 |
| 5,436,472 | 7/1995 | Ogawa . |

FOREIGN PATENT DOCUMENTS

| 0 493 051 A1 | 12/1991 | European Pat. Off. . |
| 0544149A1 | 6/1993 | European Pat. Off. . |
| 0 625692 A1 | 11/1994 | European Pat. Off. . |
| 1196471 | 6/1970 | United Kingdom . |
| 2 064862 | 6/1981 | United Kingdom . |
| 2 192709 | 1/1988 | United Kingdom . |
| 2 240 175 | 7/1991 | United Kingdom . |

*Primary Examiner*—Stephone B. Allen
*Attorney, Agent, or Firm*—Rabin, Champagne, & Lynt, P.C.

[57] ABSTRACT

In a photoelectric sensor, a photosensitive device is mounted on a substrate and outputs an electric signal corresponding to light incident thereto. A casing holds the substrate in a bore formed therein and includes a light guide portion formed of an optically transparent material for conducting incident light to the photosensitive device. A light emitting device is also mounted on the substrate for emitting light in response to a current input thereto. A seal member is molded to air-tightly seal the light emitting device and photosensitive device except for a light guide portion included in the light emitting device and a light guide portion included in the photosensitive device.

20 Claims, 12 Drawing Sheets

PHOTOELECTRIC SENSOR HAVING A LIGHT GUIDE BUILT-IN

BACKGROUND OF THE INVENTION

1. Field of the Invention

The present invention relates to a photoelectric sensor feasible for position sensing and having a small photosensitive area.

2. Description of the Background Art

A photosensitive device assembly of the kind including, e.g., a can type photosensitive device is conventional. In this kind of assembly, a glass sheet which is about 1 mm thick is located to face the photosensitive surface of the photosensitive device. The glass sheet has an optically transparent circular aperture having a diameter of about 0.6 mm at its center. To form the aperture, black ink is printed on the surface of the glass sheet facing the photosensitive surface of the device except for its center. The device is so positioned on a substrate as to face the aperture or light guide and soldered to the substrate. The axis of the light guide and that of the photosensitive surface of the device are aligned with each other. When light is incident from the outside of the assembly to the device via the light guide, the device generates an electric signal. In this way, the above assembly serves as a photoelectric sensor.

The photoelectric sensor may cooperate with a light emitting device to sense a desired subject, as also conventional. In this case, when a current is fed to the light emitting device, the device emits light toward the photoelectric sensor facing the device. In response, the photosensor outputs an electric signal.

The conventional photoelectric sensor described above has some problems left unsolved, as follows. To begin with, the glass sheet cannot be easily affixed to the photosensitive device and needs, e.g., adhesive or a damper or similar holding member. Further, it is likely that the light guide of the glass sheet and photosensitive surface of the device have their optical axes displaced from each other, degrading the sensing ability of the sensor.

When the photosensitive device is affixed to the substrate, leads included in the device are soldered to the substrate. Soldering requires an extra time and an extra step and increases the size of the photoelectric sensor. The prerequisite with this kind of sensor is that the photosensitive device and substrate be positioned parallel to each other. In practice, however, the sensor is often mounted to a utility apparatus with its photosensitive device held in a tilted position, further deteriorating the sensing ability of the sensor.

On the other hand, the photoelectric sensor and light emitting device are physically independent of each other and must be spaced by a distance greater than the width of a subject to be sensed. Therefore, such a combination occupies a substantial space. Moreover, it is difficult to align the optical axis of the photoelectric sensor and that of the light emitting device. Should the two optical axes be misaligned, the sensor would fail to receive a sufficient quantity of light or would receive no light. This lowers the reliability of the sensor.

SUMMARY OF THE INVENTION

It is therefore an object of the present invention to provide a miniature photoelectric sensor which is easy to assemble and install in a utility apparatus and can be reliably positioned and fixed in place.

It is another object of the present invention to provide a n integral photosensitive device and light emitting device assembly which is easy to assemble and install and in a utility apparatus and can be reliably positioned and fixed in place.

In accordance with the present invention, a photoelectric sensor has a photosensitive device for outputting an electric signal corresponding to light incident thereto. A substrate supports the photosensitive device thereon. A casing holds the substrate in a bore formed therein and includes a light guide portion formed of an optically transparent material for guiding incident light to the photosensitive device.

Also, in accordance with the present invention, a photoelectric sensor has a light emitting device for emitting light in response to a current input thereto. A photosensitive device generates an electric signal in response to light incident thereto. A substrate has two major surfaces to one of which the light emitting device and photosensitive device are affixed by die bonding. A seal member is molded for air-tightly sealing the light emitting device and photosensitive device except for a light guide portion included in the light emitting device and a light guide portion included in the photosensitive device.

BRIEF DESCRIPTION OF THE DRAWINGS

The objects and features of the present invention will become more apparent from the consideration of the following detailed description taken in conjunction with the accompanying drawings i n which.

In the figures, the same or similar constituent parts are designated by like reference numerals.

DESCRIPTION OF THE PREFERRED EMBODIMENTS

Figure 1:
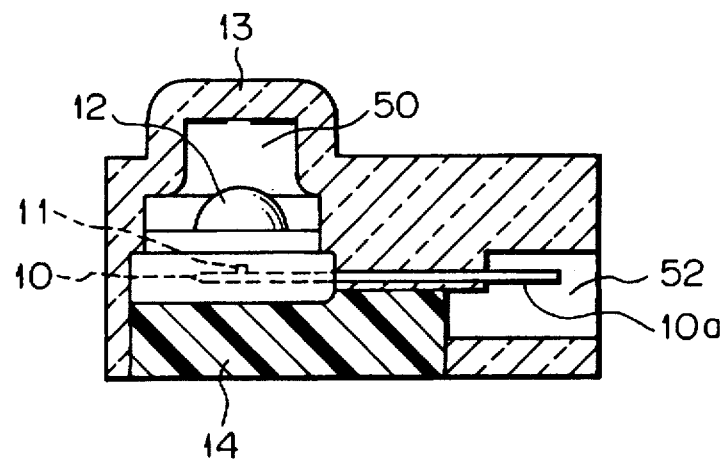
FIG. 1 is a sectional side elevation showing an embodiment of the present invention.
Figure 2:
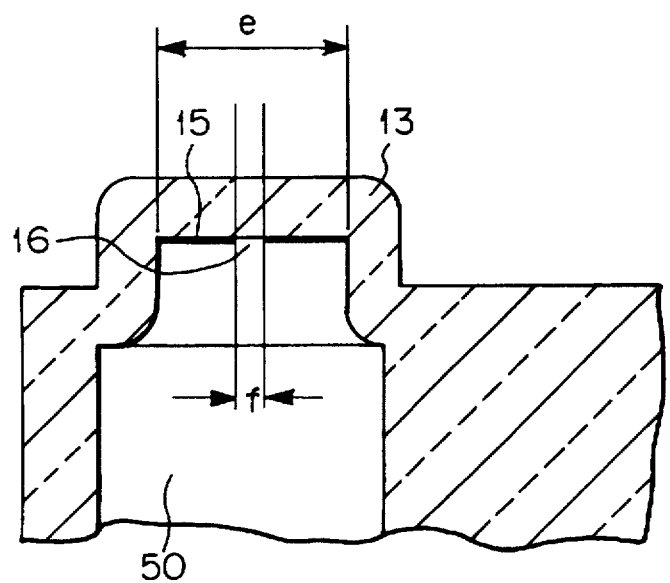
FIG. 2 is a fragmentary sectional side elevation of the embodiment shown in FIG. 1.

Referring to FIGS. 1 and 2 of the drawings, a photoelectric sensor with a built-in light guide embodying the present invention is shown. As shown, the sensor includes a substrate 10 implemented as a flat plate having two parallel major surfaces. In the illustrative embodiment, the substrate 10 is formed of an alloy containing 58% of iron and 42% of nickel, i.e., so-called 42 alloy. A photosensitive device 12 includes a chip 11 bonded to one major surface of the substrate 10. The chip 11 is formed of, e.g., a semiconductor based on GaAs (gallium arsenite) and sealed by an optically transparent hemispherical resin, thereby constituting the photosensitive device 12. The device 12 transforms light incident thereto to a corresponding electric signal and outputs the electric signal. The portion of the substrate 10 other than the portion covered with the resin constitutes an electric lead portion 10a.

The photosensitive device 12 is received in a casing 13 together with the substrate 10, as illustrated. The casing 13 is formed of an optically transparent resin and formed with a bore thereinside. The bore is made up of a generally cylindrical main bore 50 and an auxiliary bore 52 communicated to and generally perpendicular to the main bore 50. The device 12 is received in the bore 50 while the lead portion 10a of the substrate 10 is received in the bore 52, as illustrated. A rear cover 14 closes the open end or rear of the bore 50 and retains the substrate 10 in the bore of the casing 13. The cover 14 is formed of a black resin.

As shown in FIG. 2, the cylindrical main bore 50 has a bottom region e. A seal 15 is formed on the inner surface of the bottom region e and made of a light shielding material. An optical aperture 16 is formed in the seal 15 in order to admit light into the casing 13 therethrough. The aperture 16 therefore forms a light guide portion $f$ for guiding light to the photosensitive device 12. The aperture 16 has a circular shape by way of example. In a preferable configuration, the diameter of the aperture 16 is about 0.6 mm.

The seal 15 is formed of a black material which does not transmit light or from a material which reflects light. Specifically, the seal 15 may be colored black so as not to transmit light or may be colored silver so as to reflect light. If desired, the seal 15 may be replaced with a circular glass plate on which a light shielding or reflecting material is printed except for its light guide portion $f$.

Figure 3:
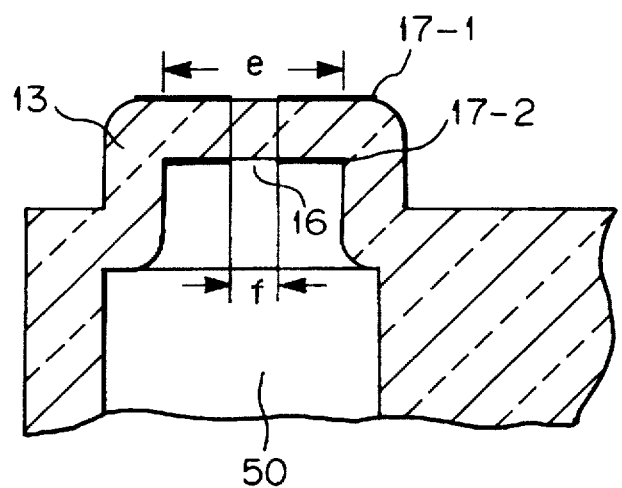
FIGS. 3 through 6 are fragmentary sectional side elevations each showing another embodiment of the present invention.

FIG. 3 shows another embodiment of the present invention which is similar to the embodiment of FIGS. 1 and 2 except for the following. As shown, a light shielding material 17-1 and/or a light shielding material 17-2 is printed on the bottom region e of the main bore 50 except for the light guide portion $f$. In the illustrative embodiment, the materials 17-1 and 17-2 are shown as being respectively printed on the outside and the inside of the bottom region e. The material 17-1 and/or the material 17-2 covers the bottom region e except for the center or light guide portion $f$, so that light can enter the casing 13 only through the portion $f$. Aluminum may be deposited on the bottom region e by vapor deposition except for the light guide portion $f$ in place of or in addition to the material 17-1 or 17-2.

Another embodiment of the present invention also similar to the embodiment of FIGS. 1 and 2 will be described with reference to FIG. 4. As shown, the embodiment has a shield member 18 received in the major bore 50 and formed with a circular hole 19 having a required photosensitive area. The shield member 18 is made of a black resin or similar light shielding resin. The circular hole 19 has a diameter corresponding to the diameter of the light guide portion $f$ and variable depending on the application. It is to be noted that the layer of a light shielding material is absent on the bottom region e of the casing 13. Although light incident to the outer periphery of the casing 13 is admitted into the casing 13, the shield member 18 prevents it from reaching the photosensitive device 12 except through its hole 19.

Figure 4:
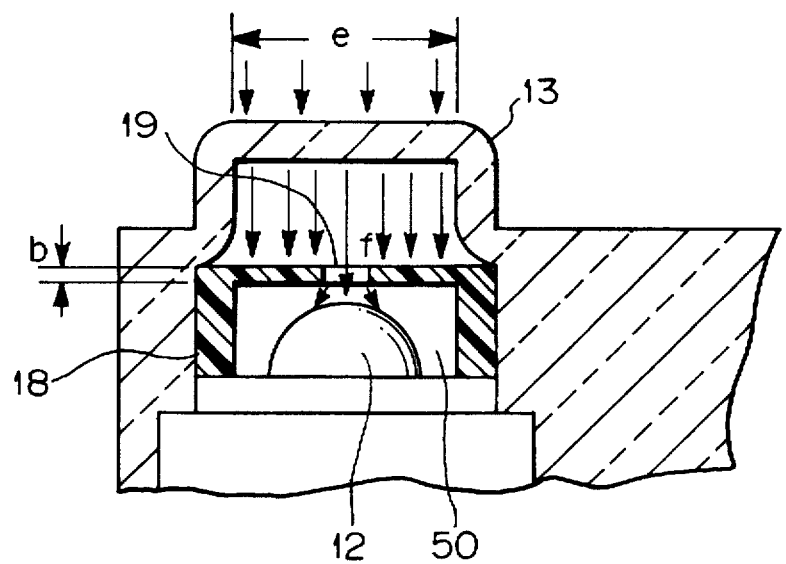
Figure 5:
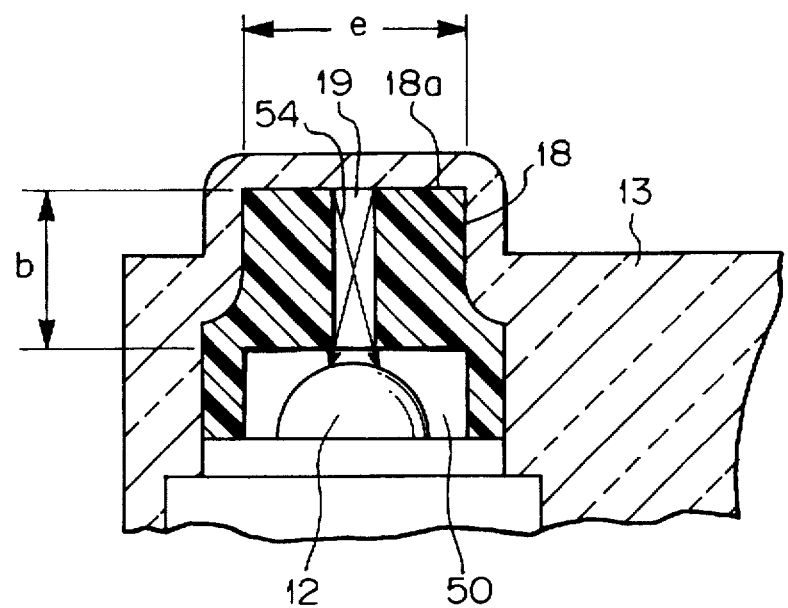

FIG. 5 shows another embodiment of the present invention similar to the embodiment of FIG. 4 except for the following. As shown, the circular hole 19 formed in the shield member 18 has a lengthwise dimension or depth b greater than the depth of the hole 19 shown in FIG. 4. The top 18a of the shield member 18 is held in contact with the bottom wall of the cylindrical bore 50. With this configuration, the embodiment prevents crosstalk light 54 incident to the casing 13 from spreading.

Figure 6:
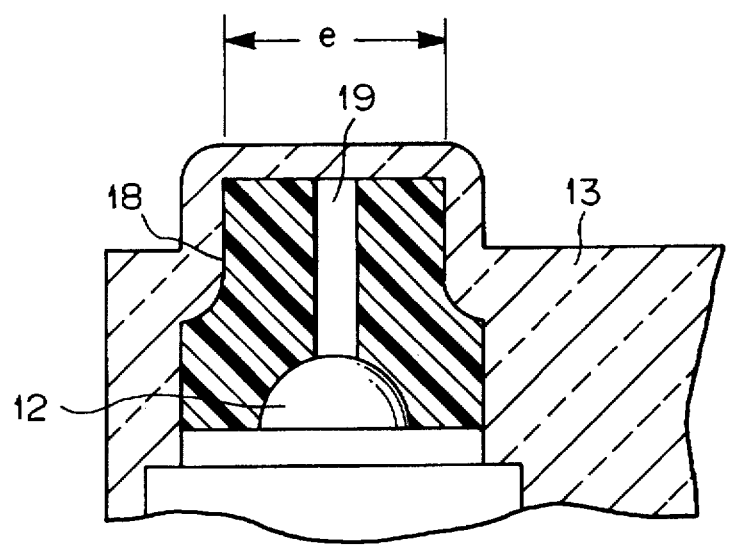

FIG. 6 shows another embodiment of the present invention similar to the embodiment described with reference to FIG. 5. As shown, the shield member 18 is configured such that the lower edge of the hole 19, as viewed in FIG. 6, contacts the photosensitive device 12. The shield member 18 has at its lower end, as viewed in FIG. 6, a hemispherical bore communicated to the hole 19 and complimentary to the hemispherical portion or convex lens portion of the device 12. In this condition, the lower end of the shield member 18 is held in tight contact with the lens portion of the device 12. The main bore 50 is entirely filled with the shield member 18. Light propagated through the hole 19 is allowed to reach the device 12 without spreading. Because the shield member 18 and device 20 tightly contact each other, the optical axis of the hole 19 and that of the device 12 are prevented from being displaced after the assembly of the photosensitive sensor.

Figure 7:
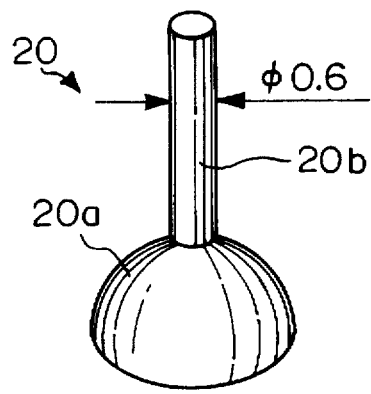
FIG. 7 is a perspective view showing a jig applicable to the embodiment of FIG. 6.

The shield member 18 shown in FIG. 6 is implemented as a molding. FIG. 7 shows a specific jig 20 for producing the shield member 18. As shown, the jig 20 is made up of a hemispherical portion 20a and a cylindrical portion 20b extending out from the portion 20a. The portions 20a and 20b respectively correspond to the convex lens portion of the photosensitive device 12 and the elongate hole 19 of the shield member 18. The portion 20b has a diameter of 0.6 cm by way of example.

Figure 8:
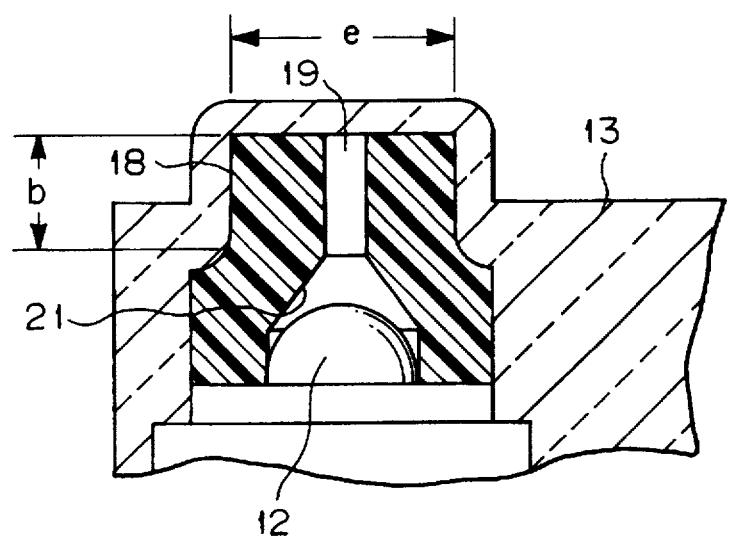
FIG. 8 is a fragmentary sectional side elevation showing another embodiment of the present invention.

In the embodiment shown in FIG. 5, light coming out of the hole 19 having the length b spreads little, as determined by experiments. In light of this, another embodiment to be described with reference to FIG. 8 also provides the hole 19 with the length b. As shown in FIG. 8, the shield member 18 is configured such that the lower end of the hole 19 merges into a frustoconical space 21 which, in turn, merges into a cylindrical space at its lower end. The space below the space 21 has the same diameter as the convex lens portion of the photosensitive device 20, so that its wall contacts the lens portion. With this configuration, it is possible to provide a light beam incident to the device 12 with substantially the same diameter as the hole 19, and to prevent the device 12 and hole 19 from being displaced relative to each other. In addition, although the light coming out of the hole 19 toward the device 12 may spread, the wall of the space 21 flared downward reflects it. As a result, substantially the entire light is incident to the center of the device 12.

In each of the embodiments shown in FIGS. 6 and 8, the optical axis of the hole 19 and that of the photosensitive device 12 are aligned with each other with the lower edge of the hole 19 or the wall of the space below the frustoconical space 21 contacting the device 12. This surely positions the hole 19 relative to the device 12.

Figure 9:
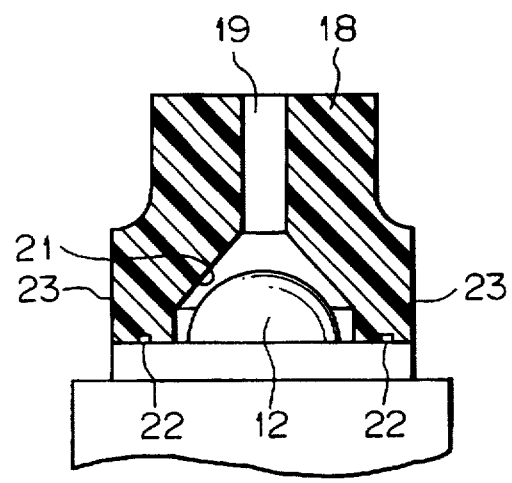
FIG. 9 is a fragmentary side elevation showing another embodiment of the present invention.
Figure 10:
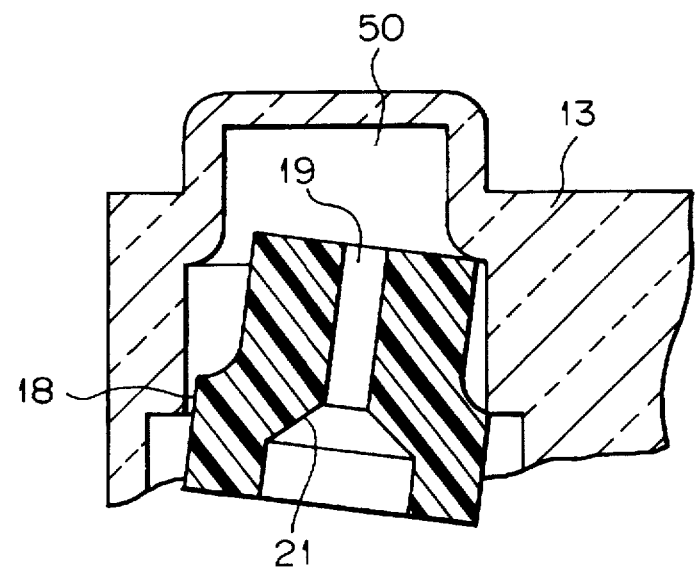
FIG. 10 is a sectional side elevation showing a shield member being inserted into a casing in a tilted position.
Figure 11:
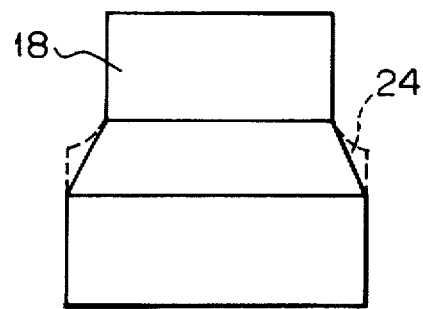
FIG. 11 is a fragmentary side elevation showing another embodiment of the present invention.

FIG. 9 shows another embodiment of the present invention including alternative positioning means. As shown, a plurality of lugs 22 are formed on the photosensitive device 12 while a plurality of recesses complementary in configuration to the lugs 22 are formed in the shield member 18. The device 12 and shield member 18 are surely positioned relative to each other with the lugs 22 and recesses mating with each other. Of course, the lugs 22 of the device 12 and the recesses of the shield member 18 may be replaced with each other. In the embodiments shown in FIGS. 5, 6 and 8, it is likely that the shield member 18 tilts during its insertion into the casing 13, as shown in FIG. 10. In the tilted position, the shield member 18 cannot be smoothly inserted into the bore 50 of the casing 13. FIG. 11 shows another embodiment of the present invention capable of preventing the shield member 18 from tilting. As shown, the shoulder of the shield member 18 intervening between the two contiguous portions is tapered, as at 24. The taper 24 allows the shield member 18 to smoothly enter the bore 50 without contacting the edge of the bore 50.

Figure 12:
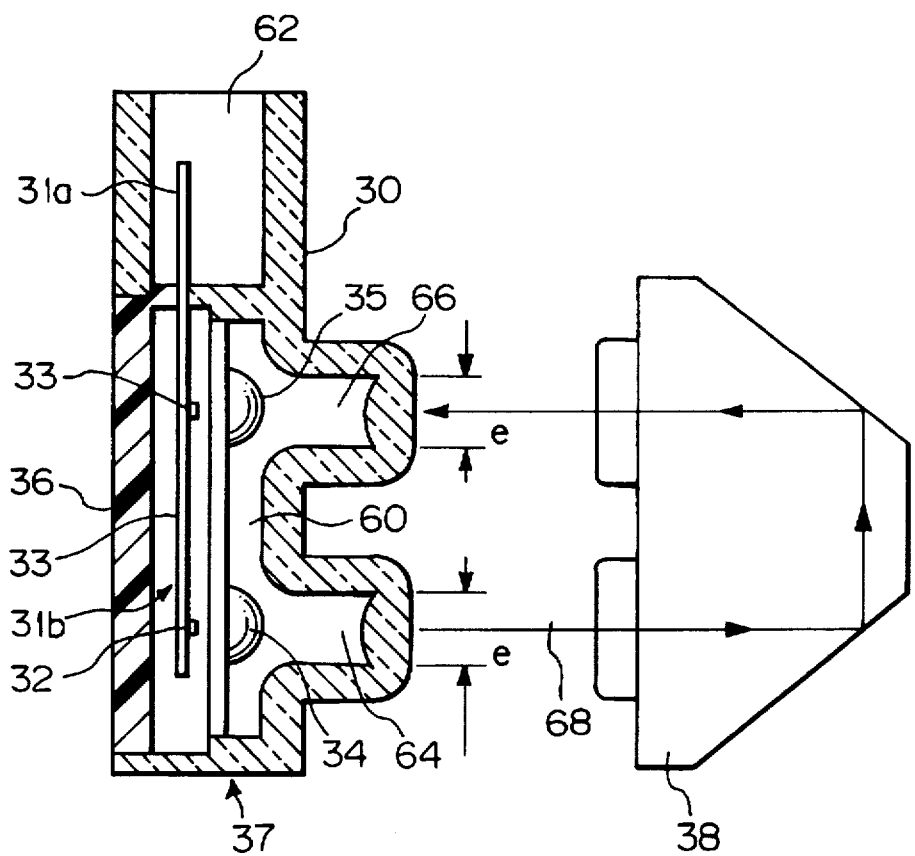
FIG. 12 is a sectional side elevation showing another embodiment of the present invention.

A reference will be made to FIG. 12 for describing another embodiment of the present invention. As shown, a substrate 31 is implemented as a flat plate having two parallel major surfaces and also formed of the previously mentioned 42 alloy. A light emitting device chip 32 and a photosensitive device chip 33 are mounted on a main portion 31b included in the substrate 31 by die bonding. The two chips 32 and 33 are formed of, e.g., a GaAs-based semiconductor. The light emitting device 32 emits light when a current is applied thereto. The photosensitive device 33 transforms light incident thereto to a corresponding electric signal and outputs it. The light emitting device chip 32 and photosensitive device chip 33 are each sealed by an optically transparent hemispherical resin by transfer molding. The chips 32 and 33 constitute a light emitting device 34 and a photosensitive device 35, respectively. The substrate 31 except for its main portion 31b covered with the resin serves as an electric lead portion 31a. The devices 34 and 35 are oriented such that their optical axes extend substantially parallel to each other.

The light emitting device 34 and light-sensitive device 35 sealed by the resin are received in a casing 30 together with the main portion 31b of the substrate 31. The casing 30 also formed of an optically transparent resin has a main bore 60 and an auxiliary bore 62 for a connector, as illustrated. The main bore 60 is made up of two cylindrical portions 64 and 66 each having a circular bottom region e. The bottom regions e constitute aspherical lenses by way of example. The two devices 34 and 35 are accommodated in the main bore 60 and positioned such that the optical axes of their spherical lens portions are respectively aligned with the center axes extending through the bottom regions e of the main bore 60. The auxiliary bore 62 is used to mechanically retain a connector socket, not shown. The portion 31a of the substrate 31 disposed in the auxiliary bore 62 plays the role of a connector pin for connecting the photosensitive sensor to a utility apparatus.

After the devices 34 and 35 have been positioned in the main bore 60, a rear cover 36 formed of a black resin is fitted in the open end or rear end of the bore 60, as illustrated. The rear cover 36 retains the substrate 31 in the bore 60 while closing the open end of the bore 60. In this condition, light is prevented from reaching the devices 34 and 35 from the rear of the assembly.

In assembly, the combination of the devices 34 and 35 is inserted in the main bore 60 of the casing 30 in such a manner as not to be tilted. Then, the rear cover 36 is fitted in the open end of the bore 60 to thereby fix the above combination in place. This completes a photoelectric sensor 37. After the sensor 37 has been installed in a utility apparatus, a prism 38 is so positioned as to face the light emitting and light-sensitive sides e of the sensor 37. In this condition, a light beam 68 issuing from the device 34 is incident to the prism 38, as indicated by arrows in FIG. 12. The beam 68 reflected by and coming out of the prism 38 is incident to the device 35.

Figure 13:
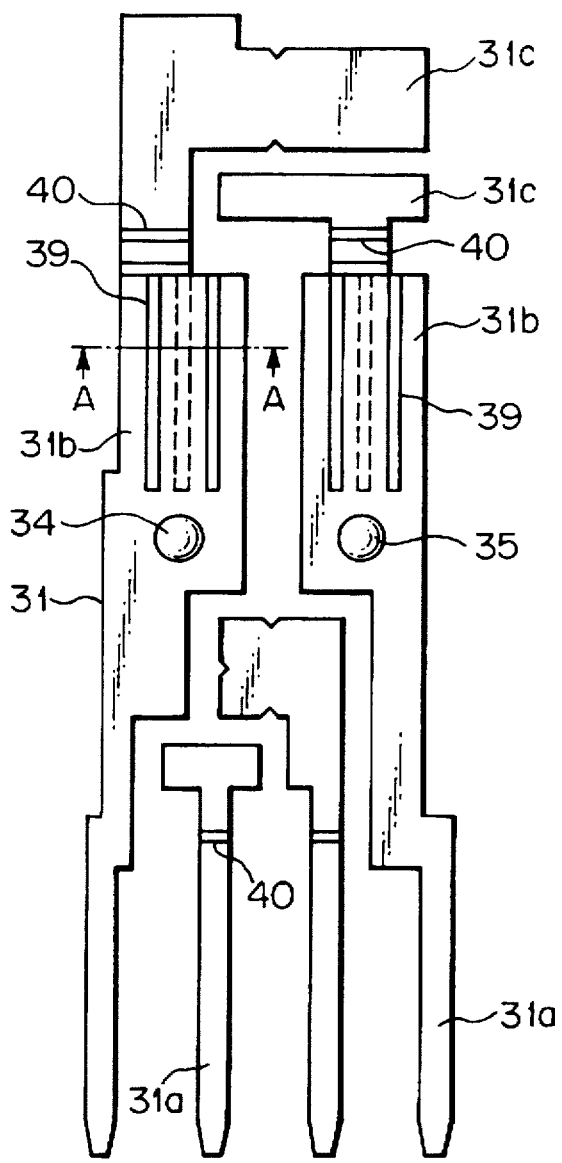
FIG. 13 is a plan view showing another embodiment of the present invention.
Figure 14:
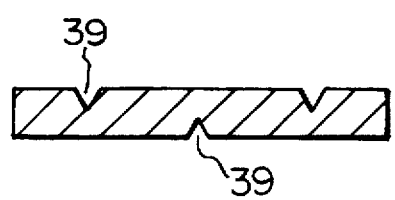
FIG. 14 is a section along line A—A of FIG. 13.

FIG. 13 shows another embodiment of the present invention. FIG. 14 is a section along line A—A of FIG. 13. As shown, the main portion 31b of the substrate 31 is formed with grooves 39 having a V-shaped section. The grooves 39 on one surface of the substrate 31 and the grooves 39 on the other surface alternate with each other. The grooves 39 extend in the lengthwise direction of the substrate 31 and prevent it from bending, twisting or otherwise deforming. The substrate 31 is as thin as about 0.25 mm by way of example.

In the illustrative embodiment, the substrate 31 has another connecting portion 31c at its end opposite to the connecting portion 31a. Grooves 40 also having a V-shaped section are formed in the substrate 31 in the widthwise direction at the positions where the connecting portions 31a and 31c adjoin the main portion 31b. The grooves 40 intercept water tending to move from the connecting portions 31a and 31c toward the main portion 31b.

The substrate 31 should preferably be as small in width as possible around the devices 34 and 35 mounted thereon, so that the penetration of water can be obviated more positively. The other portions of the substrate 31 should preferably be as great in width as possible in order to be prevented from bending, twisting or otherwise deforming.

Figure 15:
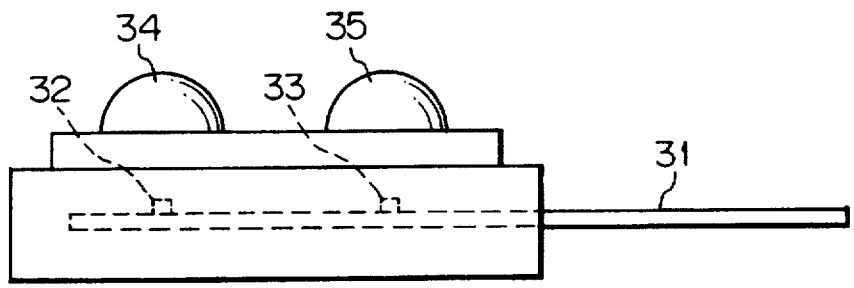
FIG. 15 is a fragmentary side elevation showing the configuration of a light emitting device and that of a photosensitive device cooperating with each other.

FIG. 15 is a fragmentary side elevation showing the combination of the devices 34 and 35. As shown, the combination is provided with contiguous shoulders at four sides thereof, so that it is not displaced from a casing, not shown.

Figure 16:
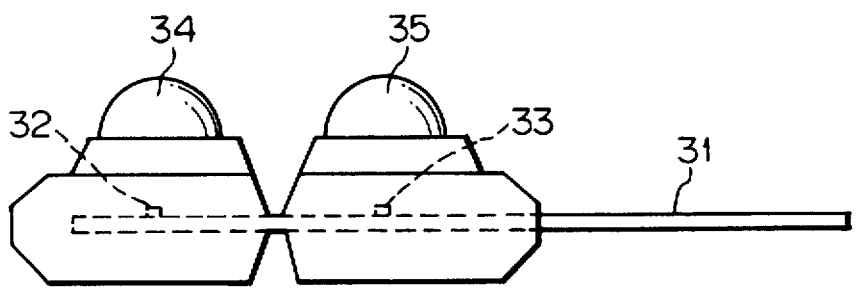
FIGS. 16 and 17 are fragmentary side elevations each showing another embodiment of the present invention.

FIG. 16 shows another embodiment of the present invention. As shown, the moldings respectively sealing the light emitting chip 32 and photosensitive chip 33 are separate from each other. The molding on the light emitting side has slant sides so as to reflect the light issuing from the chip 32 except for the light directed toward the lens portion of the light emitting device 34. Likewise, the molding on the photosensitive side has slant sides so as to exclude light other than the light incident to the lens portion of the light-sensitive device 35. The two moldings are produced by a single transfer molding operation. With this configuration, the embodiment prevents the light issuing from the chip 32 from being incident to the chip 33 by way of the moldings, i.e., without being routed through the lens portion of the device 35.

Figure 17:
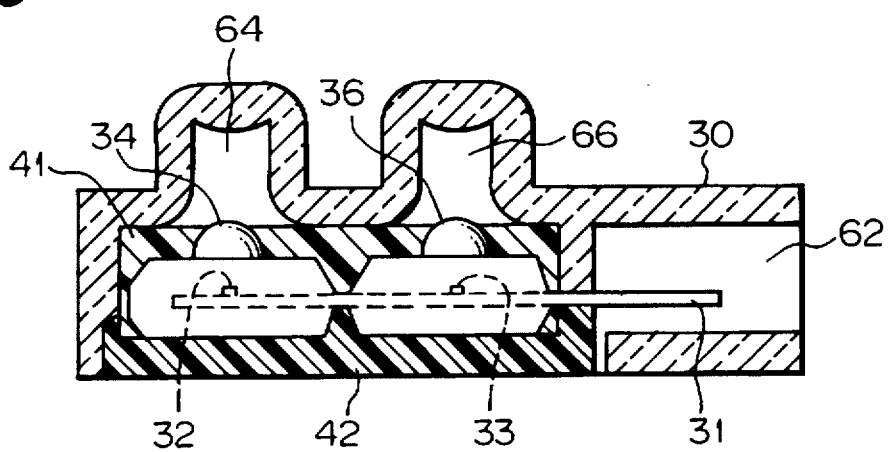

FIG. 17 shows another embodiment of the present invention. This embodiment is essentially similar to the embodiment of FIG. 16 except for the following. As shown, a shield plate 41 formed of a black resin is interposed between the light emitting chip 32 and the photosensitive chip 33. A rear cover 42 also formed of a black resin is fitted on the rear of the casing 30. This structure also successfully shields light other than the light incident to the lens portion of the photosensitive device 35. If desired, the gap between the light emitting portion and the photosensitive portion may be filled with a black silicone resin.

Figure 18:
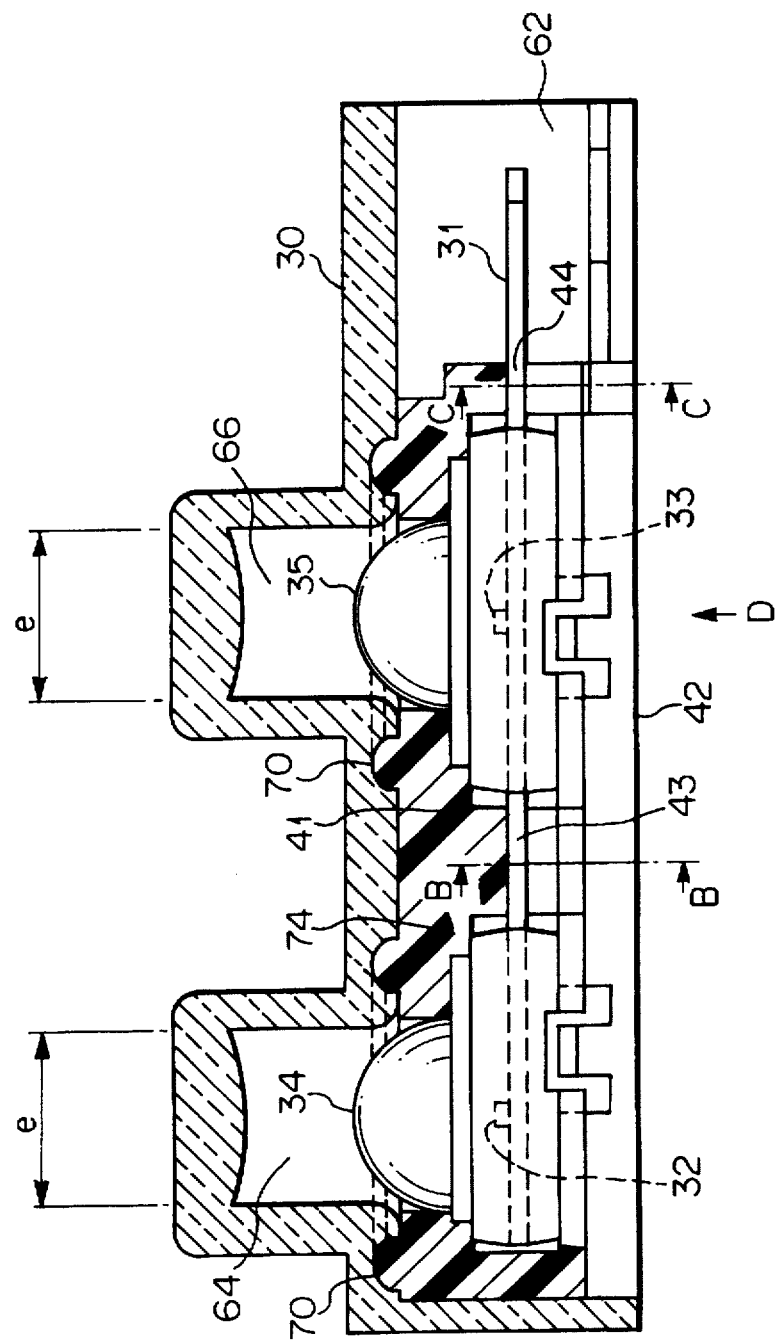
FIG. 18 is a side elevation showing another embodiment of the present invention.
Figure 19:
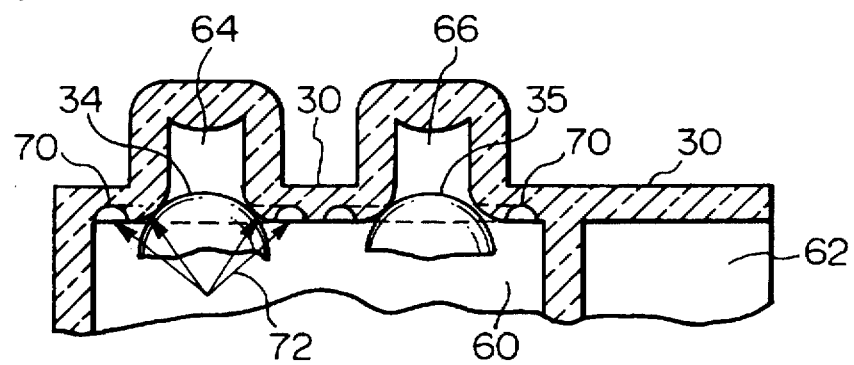
FIG. 19 is a fragmentary side elevation showing still another embodiment of the present invention.

FIG. 18 shows another embodiment of the present invention which is similar to the embodiment of FIG. 17 except for the following. As shown, the casing 30 is formed with annular recesses at its portions surrounding the open ends of the cylindrical spaces 64 and 66. The shield plate 41 is formed with annular lugs respectively corresponding to the annular recesses of the casing 30. The lugs are received in the associated recesses to thereby protect the casing 30 and shield plate 41 from displacement relative to each other. In addition, the annular lugs respectively surrounding the lens portions of the light emitting device 34 and photosensitive device 35 further enhance the light shielding ability. In FIG. 19, the light intercepted by the lugs is represented by arrows 72. As shown in FIG. 18, the moldings supporting the devices 34 and 35 are each formed with shoulders 74. The shield plate 41 firmly retain the moldings via the shoulders 74 and thereby obviates the displacement of the devices 34 and 35 more positively.

Figure 20:
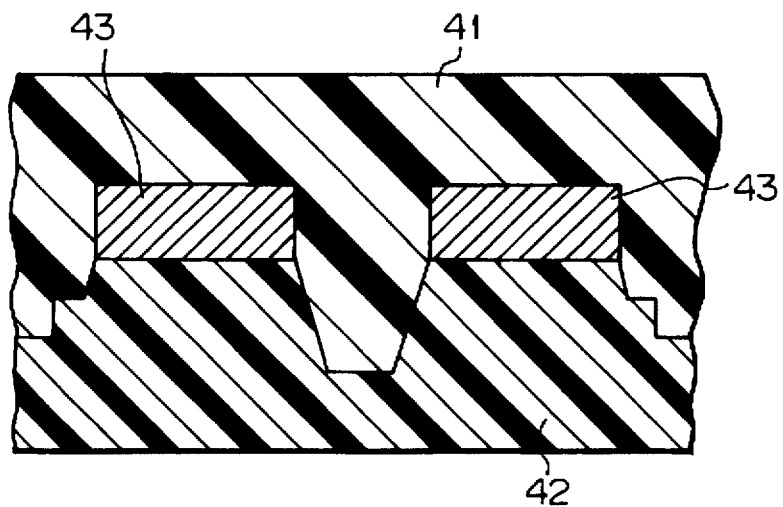
FIG. 20 is a section along line B—B of FIG. 18.

FIG. 20 is a section along line B—B of FIG. 18. As shown, the shield plate 41 and rear cover 42 are respectively provided with a concave and a convex configuration. The substrate 31 has its portion intervening between the two moldings, i.e., a lead portion 43 tightly sandwiched between the concavity of the plate 41 a n d the convexity of the cover 42. In this condition, the lead portion 43 of the substrate 31 is prevented from bending or otherwise deforming.

Figure 21:
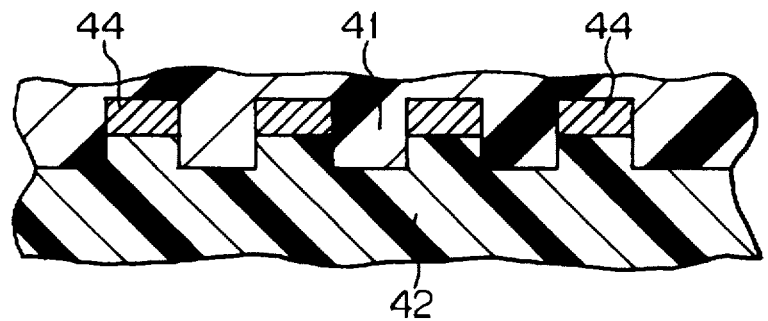
FIG. 21 is a section along line C—C of FIG. 18.

FIG. 21 is a section along line C—C of FIG. 18. As shown, the substrate 31 has its another lead portion 44 also tightly sandwiched between the shield plate 41 and the rear cover 42, so that the lead portion 44 is protected from deformation. In addition, this configuration prevents dust and other impurities from penetrating into the assembly.

Figure 22:
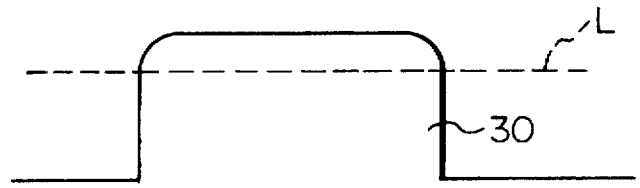
FIG. 22 is a fragmentary side elevation showing yet another embodiment of the present invention.
Figure 23:
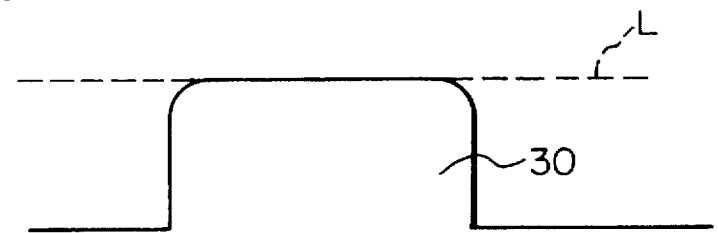
FIG. 23 is a fragmentary side elevation showing a modification of the embodiment of FIG. 22.

FIG. 22 shows still another embodiment of the present invention. Generally, in the event of molding of the casing 30, bubbles are likely to appear in the lens portions of the casing 30. As shown in FIG. 22, this embodiment releases the bubbles by providing the round portion of each lens portion with a parting line L for parting a mold. Alternatively, as shown in FIG. 23, the parting line L may be provided at the top of the lens portion. This is also successful to release the air bubbles from the casing 30.

Figure 24:
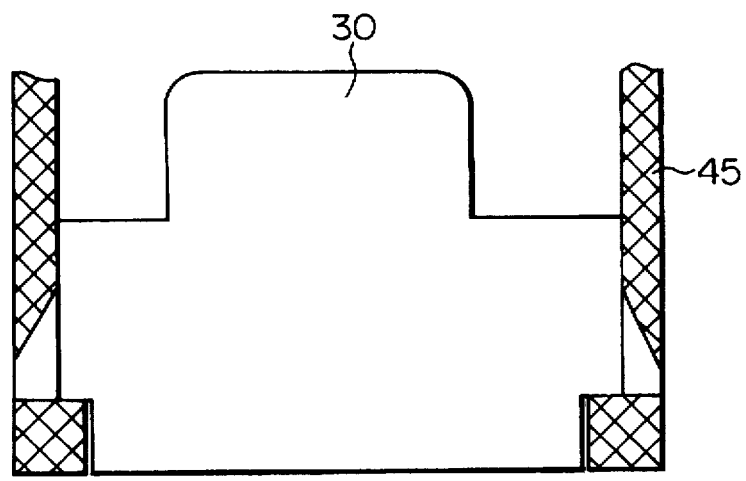
FIGS. 24 and 25 are fragmentary sectional side elevations each showing a further embodiment of the present invention.

FIG. 24 shows yet another embodiment of the present invention and corresponds to a portion D included in FIG. 18. If the casing 30 mounted to a utility apparatus does not contact metal fittings 45 over a sufficient area, it is apt to slip out of the utility apparatus. In light of this, in the illustrative embodiment, the casing 30 has its thickness changed stepwise in order to increase the above contact area. Specifically, the thickness of the casing is smaller in its portion to be mounted to a utility apparatus than in the other portion.

Figure 25:
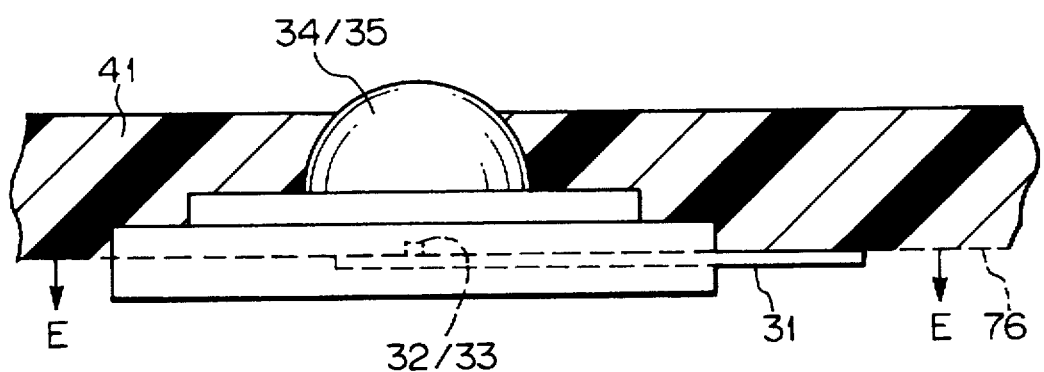

FIG. 25 shows a further embodiment of the present invention. As shown, the wall of the shield plate 41 isolating the light emitting device 32 and photosensitive device 33 has a height greater than the height of the surface 76 of the substrate 31 opposite to the die bonding surface. Specifically, the above wall is extended in a direction indicated by an arrow E in FIG. 25.

In summary, it will be seen that the present invention provides a photoelectric sensor having a substrate, a photosensitive device mounted on the substrate by die bonding, and a light guide assembled integrally in a single casing including a light transmitting region. Specifically, all the constituent parts of the sensor are positioned relative to each other and firmly fixed in place before the sensor is mounted to a utility apparatus. The sensor is therefore easy to assemble and install and is reliably positioned a n d fixed in place. This protects the constituent parts from displacement, reduces the assembling time and mounting time, and miniaturizes the utility apparatus.

In accordance with the present invention, a light emitting device is also mounted on the same substrate as the photoelectric sensor. The light emitting device and photosensitive device are sealed by molding to constitute a single assembly. Hence, all the constituent parts of the two devices are positioned relative to each other and firmly fixed in place before the assembly is mounted to a utility apparatus. Again, such an assembly is easy to assemble and install and is reliability positioned and fixed in place. This protects the constituent parts of the two devices from displacement, reduces the assembling time and mounting time, and miniaturizes the utility apparatus.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. A photoelectric sensor comprising:
   a photosensitive device for outputting an electric signal corresponding to light Incident thereto;
   a substrate supporting said photosensitive device thereon;
   a casing holding said substrate in a bore formed in said casing, and including a light guide portion formed of an optically transparent material for guiding the incident light to said photosensitive device; and
   a shield member formed of a light shielding resin and having a hole formed therein at a position associated with the light guide portion, the hole having a diameter corresponding to a preselected photosensitive area and a depth sufficient to prevent light incident thereto from spreading.

2. A photoelectric sensor in accordance with claim 1, wherein said shield member has tapered corners at an outer periphery thereof.

3. A photoelectric sensor in accordance with claim 1, wherein said shield member includes means for positioning said shield member relative to said photosensitive device.

4. A photoelectric sensor in accordance with claim 1, further comprising a rear cover formed of a light shielding material and fitted in said bore of said casing to thereby hold said substrate in said casing.

5. A photoelectric sensor comprising:
   a light emitting device for emitting light in response to a current input thereto;
   a photosensitive device for outputting an electric signal corresponding to light incident thereto;
   a substrate having two major surfaces to one of which said light emitting device and said photosensitive device are affixed by die bonding; and
   a molded seal member for sealing said light emitting device and said photosensitive device;
   said seal member including a first portion sealing said light emitting device and a second portion separated from said first portion and sealing said photosensitive device.

6. A photoelectric sensor in accordance with claim 5, wherein grooves each having a V-shaped section are formed in portions of said two major surfaces of said substrate other than molded portions in an alternating arrangement.

7. A photoelectric sensor in accordance with claim 5, wherein said seal member has molded surfaces thereof inclined for reflecting light inward.

8. A photoelectric sensor in accordance with claim 1, wherein said light emitting device and said photosensitive device are positioned on said substrate with optical axes thereof extending parallel to each other.

9. A photoelectric sensor in accordance with claim 8, further comprising a prism having a light input surface substantially perpendicular to said optical axes and for receiving light from said light emitting device and returning said light to said photosensitive device.

10. A photoelectric sensor in accordance with claim 5, further comprising a shield member provided on an outer periphery of said seal member.

11. A photoelectric sensor in accordance with claim 10, wherein said shield member has a wall higher than a surface of said substrate opposite to a die bonding surface.

12. A photoelectric sensor in accordance with claim 5, further comprising a casing having a bore thereinside and holding said substrate in said bore, wherein said casing includes light guide portions formed of an optically transparent material at least at a position for guiding light output from said light emitting device and a position for guiding light input to said photosensitive device.

13. A photoelectric sensor in accordance with claim 12, further comprising a shield member for shielding light from said seal member except for said light emitting device and said light-sensitive device.

14. A photoelectric sensor in accordance with claim 12, wherein said casing has a parting line for a mold at ends of said light guide portions.

15. A photoelectric sensor in accordance with claim 12, wherein said shield member comprises lugs respectively surrounding a light output portion and a light input portion at positions where said shield member contacts said casing.

16. A photoelectric sensor in accordance with claim 12, wherein said casing has a thickness thereof changed stepwise such that the thickness is smaller in a portion to be mounted to a utility apparatus than in the other portion.

17. A photoelectric sensor in accordance with claim 12, wherein said shield member, said casing and said seal member are arranged in a stepwise configuration for positioning.

18. A photoelectric sensor in accordance with claim 12, further comprising a rear cover formed of a light shielding material and holding said substrate in said casing.

19. A photoelectric sensor in accordance with claim 18, wherein said substrate, said shield member and said rear cover have concavity and convexity mating with each other in portions thereof contacting each other.

20. A photoelectric sensor comprising:

a light emitting device for emitting light in response to a current input thereto;

a photosensitive device for generating an electric signal in response to light incident thereto;

a substrate having two major surfaces on one of which said light emitting device and said photo-sensitive device are affixed by die bonding;

a molded seal member sealing said light emitting device and said photosensitive device;

a casing having a bore thereinside and holding said substrate in the bore, said casing including light guide portions formed of an optically transparent material at least at a position for guiding light output from said light emitting device and a position for guiding light input to said photosensitive device; and a rear cover formed of a light shielding material and holding said substrate in said casing, said substrate, said shield member, and said rear cover having concave and convex portions mating with each other in areas of contact.

* * * * *